United States Patent [19]

Schemmel et al.

[11] Patent Number: 4,936,653
[45] Date of Patent: Jun. 26, 1990

[54] CERIUM OXYFLUORIDE ANTIREFLECTION COATING FOR GROUP II-VI PHOTODETECTORS AND PROCESS FOR FORMING SAME

[75] Inventors: Terence D. Schemmel; Samuel F. Pellicori, both of Santa Barbara, Calif.

[73] Assignee: Santa Barbara Research Center, Goleta, Calif.

[21] Appl. No.: 201,670

[22] Filed: Jun. 2, 1988

[51] Int. Cl.$^5$ ................................................. G02B 1/10
[52] U.S. Cl. ..................... 350/164; 350/166; 250/370.01; 204/192.11
[58] Field of Search ................. 350/164, 165, 166; 204/192.1, 92, 192.34, 191, 192.11; 250/370.01; 357/30 R, 71 R; 428/433, 216, 697, 702

[56] References Cited

U.S. PATENT DOCUMENTS 3,958,042  5/1976  Katsube et al. ................ 350/164
4,610,771  9/1986  Gillery ........................... 204/192.1
4,646,120  2/1987  Hacskaylo ...................... 357/30 R

FOREIGN PATENT DOCUMENTS 0191682  8/1986  European Pat. Off. .
0241083  10/1987  European Pat. Off. .

OTHER PUBLICATIONS

Thin Solid Films, vol. 148, No. 1, 30 Mar. 1987, I. Lubezky et al., "Activated Reactive Evaporation of a Transparent Conductive Coating for the IR Region", pp. 83–92.
Solar Cells, vol. 3, No. 1, Feb. 1981, S. F. Pellicori: "Wide Band Wide Angle Reflection-Reducing Coatings for Silicon Cells", pp. 57–63.
Applied Optics, vol. 22, No. 12, 15 Jun. 1983, Optical Society of America, I. Lubezky et al.: "Efficient and Durable AR Coatings for Ge in the 8–11-$\mu$m Band Using Synthesized Refractive Indicies by Evaporation of Homogeneous Mixtures", pp. 1828–1831.

*Primary Examiner*—Eugene R. LaRoche
*Assistant Examiner*—Thong Nguyen
*Attorney, Agent, or Firm*—W. C. Schubert; W. K. Denson-Low

[57] ABSTRACT

A durable quarter wave antireflection coating for a photodetecting device 20, the photodetecting device being formed within a radiation absorbing layer 22 of HgCdTe which is epitaxially grown upon a surface of a substantially transparent Group II–VI substrate 24 having an index of refraction of between approximately 2.2 and 2.8. By example, the substrate 24 may comprise CdZnTe or CdTe. The antireflection coating 26 is formed upon a radiation receiving surface of the substrate 24. The antireflection coating may comprise a layer of $CeO_xF_{(3.0-x)}$, where x has a value within the range of approximately zero to approximately 1.0. The $CeO_xF_{(3.0-x)}$ layer is formed by an ion beam sputter technique, the $CeO_xF_{(3-x)}$ layer being sputtered from a source comprised of $CeF_3$ in the presence of a predetermined pressure of oxygen. In general, the antireflection coating may comprise a fluoride compound formed with a metal of the Lanthanide rare earth series which is substantially transparent to infrared radiation.

19 Claims, 2 Drawing Sheets

% TRANSMITTANCE OF CdZnTe COATED ON BOTH SURFACES WITH QUARTER WAVE $CeO_xF_{(3-x)}$ FILMS

FIG. 1A UNCOATED CdTe
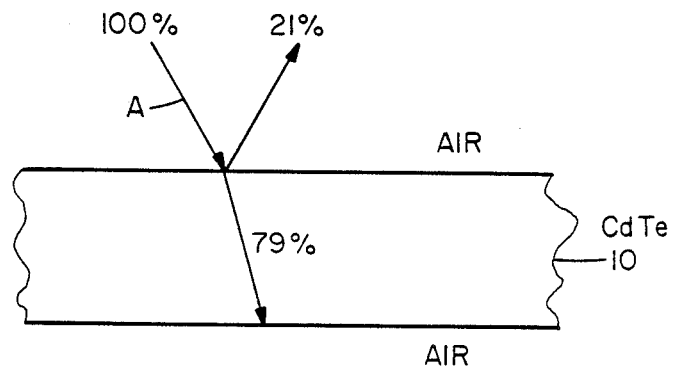
FIG. 1B CdTe HAVING 1/4 WAVE COATINGS
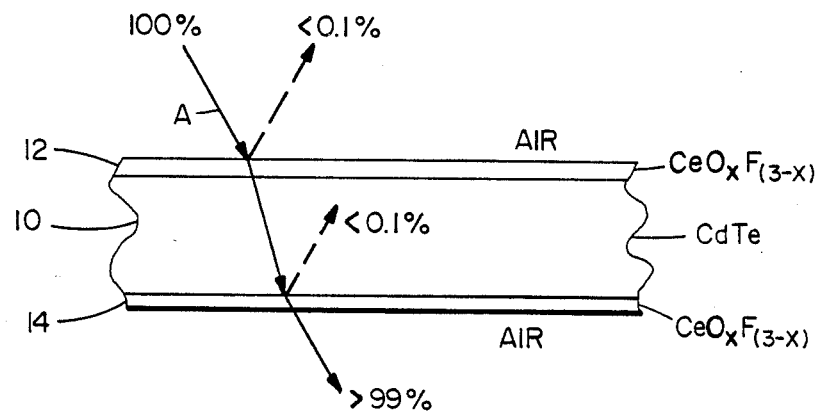
FIG. 3
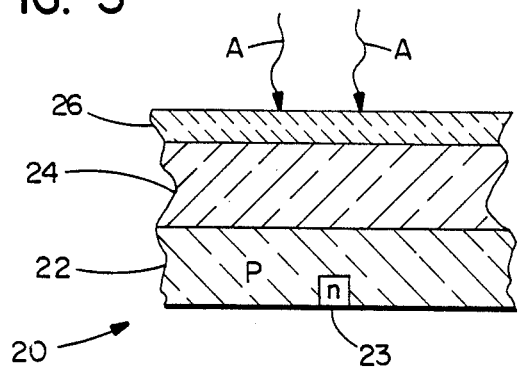

% TRANSMITTANCE OF CdZnTe COATED ON BOTH SURFACES WITH QUARTER WAVE $CeO_xF_{(3-x)}$ FILMS

CERIUM OXYFLUORIDE ANTIREFLECTION COATING FOR GROUP II-VI PHOTODETECTORS AND PROCESS FOR FORMING SAME

FIELD OF THE INVENTION

This invention relates generally to antireflection (AR) coatings for Group II–VI photodetectors and, in particular, relates to a durable, highly effective antireflection coating for CdZnTe and CdTe, the coating comprising a cerium oxyfluoride film deposited by a low temperature ion beam sputtering technique.

BACKGROUND OF THE INVENTION

Antireflection coatings are employed on photodetecting materials in order to minimize losses due to reflection of incident radiation at the material/air boundary. As can be appreciated, any incident radiation which is reflected from the boundary is unavailable to be absorbed within the material and is therefore undetectable. This problem is especially apparent with modern photodetecting devices, such as photodetectors comprised of Group II–VI material, which are designed to detect relatively small amounts of incident infrared (IR) radiation. The photodetecting device may have a substrate comprised of an alloy such as cadmium-zinc-telluride (CdZnTe) or cadmium-telluride (CdTe) and an overlying epitaxial radiation absorbing layer of mercury-cadmium-telluride (HgCdTe). Such a device may be fabricated as a backside illuminated photodetector wherein the incident radiation enters the photodetector through a back surface of the transparent CdZnTe substrate layer, the back surface being opposite a surface wherein an array of photodiodes or photoconductors is formed within the HgCdTe epilayer.

An antireflection coating preferably has an index of refraction which provides the desired antireflection characteristics while also exhibiting the property of being substantially transparent to the incident radiation. The coating should also be amenable to being formed at a relatively low temperature to avoid altering the stoichiometry of the HgCdTe layer. The coating should also be durable and be capable of withstanding typical photodetector fabrication techniques such as thermal cycling, solvent rinsing, acid rinsing and similar processes.

Until now, no antireflection coating was known for CdTe or CdZnTe which exhibited the desirable qualities set forth above.

It is therefore one object of the invention to provide an AR coating material having an index of refraction which causes minimum reflection from a CdZnTe substrate or other substrate materials having refractive indices in the range between approximately 2.2 and approximately 2.8.

It is another object of the invention to provide an AR coating which causes minimal reflection of radiation within a range of wavelengths between about 1 and 12 micrometers and which also exhibits little or no absorption at wavelengths between about 1 and 9 micrometers.

It is another object of the invention to provide an AR coating which adheres durably to CdZnTe during the chemical and handling processes experienced in the fabrication of detectors and which further may be applied early in the detector device fabrication process, thereby increasing device production yield.

It is another object of the invention to provide an AR coating which increases the detective quantum efficiency of backside illuminated detectors.

It is a further object of the invention to provide an AR coating which exhibits sufficiently low mechanical stress to permit the coating to be grown to physical thicknesses corresponding to quarter wavelength optical thicknesses at long infrared wavelengths.

It is one further object of the invention to provide an AR coating which is comprised of a fluoride compound formed with a metal of the Lanthanide rare earth series which is transparent to infrared radiation.

It is another object of the invention to provide an AR coating which is deposited by a process of low temperature, high energy ion beam sputtering of a $CeF_3$ source material.

It is another object of the invention to provide an AR coating process in which a small quantity of oxygen is introduced to a growing $CeF_3$ film to serve as a substitute for fluorine atoms which are partially depleted during the sputter deposition of the $CeF_3$ source material and thus restore the transparency which is typically decreased with the loss of flourine atoms.

It is another object of the invention to provide an AR coating process whereby the resulting $CeO_xF_{(3-x)}$ layer exhibits low radiation absorption and a corresponding high transmissibility due to the substitution of oxygen atoms for depleted fluorine atoms.

It is a still further object of the invention to provide a low temperature AR coating process that is suitable for HgCdTe detector fabrication without risk to the stoichiometry of the HgCdTe.

SUMMARY OF THE INVENTION

The foregoing objects are achieved and other advantages are realized by an AR coating and a method of forming same which, in accordance with the invention, provides a quarter wavelength antireflection coating for a photodetecting array, the photodetecting array being formed within a radiation absorbing layer of HgCdTe which is epitaxially grown upon a surface of a substantially transparent Group II–VI substrate having an index of refraction of between approximately 2.2 and 2.8. By example, the substrate may comprise CdZnTe or CdTe. The antireflection coating is formed upon a radiation receiving surface of the substrate. The antireflection coating is comprised of a thin film layer or coating of a fluoride formed with a metal of the Lanthanide rare earth series which is transparent to infrared radiation, such as $CeO_xF_{(3.0-x)}$, where x has a value within the range of approximately zero to approximately 1.0. The $CeO_xF_{(3.0-x)}$ layer is formed by an ion beam sputter technique, the $CeO_xF_{(3.0-x)}$ layer being sputtered from a solid source comprised of the compound $CeF_3$ in the presence of a predetermined pressure of oxygen.

In accordance with a method of the invention there is disclosed the formation of a durable antireflection layer upon a surface of a body of Group II–VI material at relatively low temperatures. The method includes the steps of providing a body comprised of Group II–VI material within a chamber, the chamber having at least a predetermined background pressure and a predetermined oxygen pressure; providing a target source within the chamber, the target source comprising $CeF_3$; ion beam sputtering $CeF_3$ from the source to form a film layer upon a surface of the body; and actively replacing fluorine atoms which are depleted from the layer during the sputtering process, the depleted fluorine atoms being replaced with oxygen atoms such that the film layer has the composition $CeO_xF_{(3.0-x)}$, where x may vary between approximately zero and 1.0.

BRIEF DESCRIPTION OF THE DRAWING

The foregoing aspects of the invention will be made more apparent in the following Detailed Description of Preferred Embodiments read in conjunction with the accompanying drawing, wherein:

FIG. 1A is a cross-sectional view of a CdTe slab which illustrates the losses typically experienced by a beam of incident radiation in passing through a slab having no antireflecting coating applied thereto;

FIG. 1B is a cross-sectional view of a CdTe slab which illustrates the significant reduction in losses experienced by a beam of incident radiation for a slab having a $CeF_3$ antireflection film applied to opposing surfaces thereof;

FIG. 3 is a illustrative cross-sectional view, not to scale, of a composite HgCdTe/CdZnTe backside illuminated photodiode having a $CeO_xF_{(3-x)}$ antireflection coating applied to the back surface thereof.

DETAILED DESCRIPTION OF PREFERRED EMBODIMENTS

Figure 2:
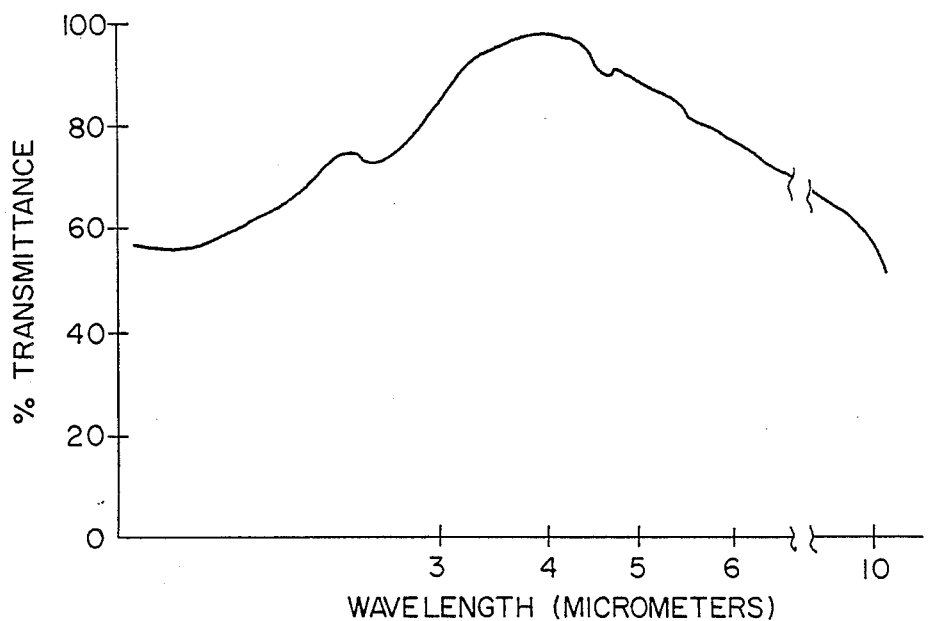
FIG. 2 is a graph which illustrates the percent of transmittance versus wavelength of radiation through a layer of CdZnTe coated on opposite surfaces with an antireflection coating comprised of quarter wave thick films of $CeO_xF_{(3-x)}$.

Referring now to FIG. 1A there is shown in cross-section the surface of an uncoated slab or substrate 10 of CdTe having a radiation beam, designated by A, incident upon a surface thereof. As can be seen, due to the high refractive index contrast at the air/CdTe interface a significant portion of the incident radiation is reflected away from the CdTe substrate 10. That is, approximately 21 percent of the incident radiation is lost to reflection leaving only approximately 79 percent of the incident radiation to pass into the substrate 10. The presence of the second, or bottom, CdTe/air interface would cause an additional loss of 13 percent because of multiple reflections between both the top and the bottom surfaces.

Referring to FIG. 1B there is shown the CdTe substrate 10 having, in accordance with the invention, an antireflection coating 12 applied to the surface wherein the radiation beam A is incident. FIG. 1B also shows a second AR coating 14 applied to an opposite surface thereof. In accordance with the invention, the coating is comprised of cerium oxyfluoride ($CeO_xF_{(3.0-x)}$). As can be seen, the percentage of radiation which passes through the doubly AR coated substrate 10 is approximately 99 percent. That is, the radiation lost to reflection has been reduced by an amount greater than 34 percent.

In accordance with the invention coatings 12 and 14 are quarter wave coatings having a physical thickness (PT) given by the equation, $$PT = \frac{L}{4n} \quad (1)$$

where n is the index of refraction of the coating material and L is the wavelength of the incident radiation.

In accordance with a preferred embodiment of the invention the coating material is comprised of cerium oxyfluoride ($CeO_xF_{(3-x)}$) which has an index of refraction of approximately 1.6. For example, a quarter wave coating for incident radiation having a wavelength of 4 micrometers has a physical thickness of approximately 0.625 micrometers.

Figure 4:
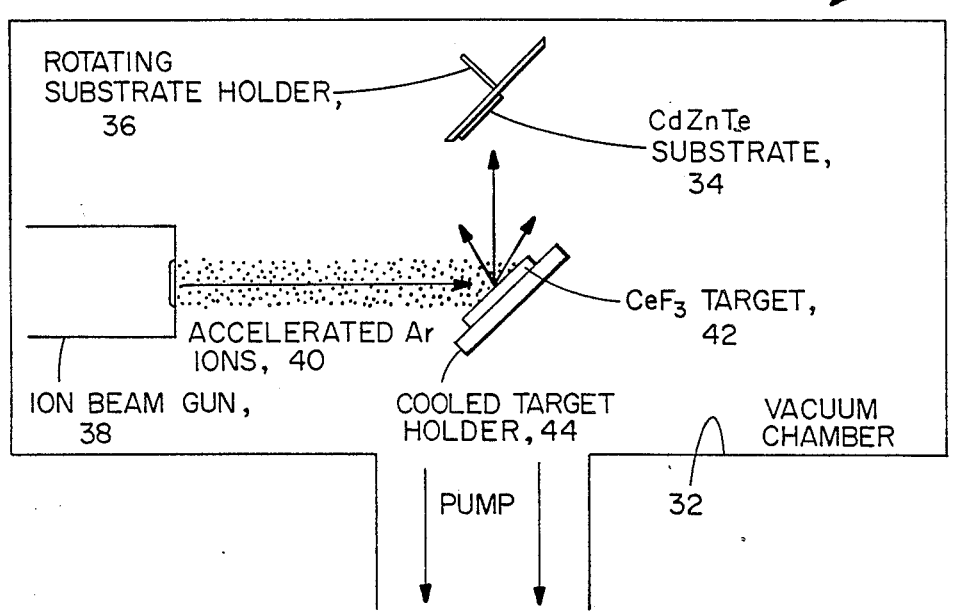
FIG. 4 is a simplified block diagram of an ion beam sputtering apparatus useful for practicing the method of the invention.

As is illustrated in FIG. 4 and in accordance with a preferred method of the invention of forming the AR coating a substrate 34 of CdTe or CdZnTe is mounted on a rotating substrate holder 36 within a high vacuum chamber 32 suitable for ion beam sputter deposition. A solid target 42 of source material is comprised of $CeF_3$ which preferably has a purity of approximately 99.99%. An ion beam gun 38 directs a stream 40 of accelerated argon ions at the target 42. The target 42 may be mounted on a cooled target holder 44. $CeF_3$ molecules are sputtered from the target and form a layer or film upon the substrate 34. The background pressure within the chamber is approximately $8 \times 10^{-7}$ Torr, argon pressure is approximately $7.5 \times 10^{-5}$ Torr and oxygen pressure is approximately $5 \times 10^{-6}$ Torr. A plasma discharge current is approximately 4 amps. An ion beam current is approximately 100 mA at a voltage of approximately 1000 V. An accelerator grid current is approximately 2.0 mA at a voltage of approximately 125 V. The coating is ion sputtered onto the substrate 34 to the desired thickness.

In accordance with one aspect of the invention the oxygen supplied to the chamber during the sputter deposition process replaces fluorine atoms which are depleted or lost from the layer during the sputtering and layer growth; thereby eliminating the increased amount of radiation absorption that a fluorine deficient film is known to exhibit. Thus, any fluorine atoms which are depleted from the surface are replaced by oxygen atoms yielding a coating having the composition $CeO_xF_{(3.0-x)}$, where x may vary between approximately zero and 1.0.

It should be realized that the pressures and other operating parameters given above are provided as examples only and that the method of the invention is not intended to be limited to these pressures and parameters. It should also be realized that a noble gas other than argon may be employed. Argon is a presently preferred gas in that it is relatively inexpensive and has sufficient mass to sputter effectively. Of importance is the ratio of oxygen pressure to argon pressure within the chamber, which is maintained within a range of approximately five percent to 10 percent, the example given above being a ratio of approximately 6.6 percent.

During the sputter deposition of the coating 12 and 14 it has been observed that the substrate temperature does not exceed 50° C., a typical value being 45° C. This relatively low temperature deposition made possible by the method of the invention advantageously avoids damage to HgCdTe material which is often provided as an epitaxial layer upon the CdZnTe or CdTe substrate. That is, the stoichiometry of the HgCdTe material is not significantly altered. As is well known, the Hg chemical bond is a relatively weak bond which is readily broken at elevated temperatures. Once the bond is broken the Hg may diffuse out of the structure, thereby altering the stoichiometry of the HgCdTe material.

During the deposition of the layer of $CeO_xF_{(3.0-x)}$ the thickness of the layer and the rate of deposition may be monitored by a conventional quartz crystal monitor (not shown in FIG. 4). For example, a monitor manufactured by Inficon and known as the IC 6000 may be employed.

Referring now to FIG. 2 there is shown in graphical form the percent of radiation transmitted as a function of wavelength through a CdZnTe substrate which is coated on both surfaces with a $CeO_xF_{(3.0-x)}$ AR coating. As can be seen, the percent of transmittance peaks at approximately 99 percent at a wavelength of approximately 4 micrometers where the coating layers are a quarter of a wavelength in optical thickness. This percent of transmittance at 4 micrometers is substantially greater than that of an uncoated CdZnTe substrate.

Referring now to FIG. 3 there is shown (not to scale) a cross-sectional view of an illustrative backside illuminated photodiode device 20. Device 20 has a radiation absorbing layer 22 which may be comprised of p-type HgCdTe material. Formed within a surface of this layer 22 is an n-type region 23 which forms a p-n diode junction with the surrounding p-type HgCdTe material. The HgCdTe layer 22 is typically epitaxially grown upon a transparent substrate 24 comprised of Group II-VI material, such as CdTe or CdZnTe. Overlying the substrate 24 is, in accordance with the invention, an AR layer 26 comprised of $CeO_xF_{(3.0-x)}$. Infrared radiation, indicated by the arrows A, incident upon the substantially transparent AR layer 26 is not significantly reflected therefrom. This incident radiation A passes substantially unimpeded through AR layer 26 and with minimal reflection into and through the substrate 24. The radiation thereafter is absorbed within the HgCdTe layer 22, generating charge carriers which are detected as a current flow across the p-n junction. It can be seen that the quantum efficiency of the device 20 is significantly improved in that substantially all of the radiation incident upon the back surface is available to be detected within the device 20. Not shown in FIG. 3 are conductive terminals for coupling the photogenerated current from the device. Also not shown are a plurality of similar photodiodes which are typically formed as an array within the HgCdTe layer 22.

It should be realized that the device 20 shown in FIG. 3 is illustrative only in that the AR coating of the invention may also be advantageously applied upon photoconductive devices and upon large arrays of photodiodes and photoconductive devices. Furthermore, it can be appreciated that due to the index of refraction of the $CeO_xF_{(3.0-x)}$ coating, being approximately 1.6, that the coating causes a minimum reflection from substrate materials having refractive indices in the range of approximately 2.2 to approximately 2.8. Also, the AR coating may be utilized for radiation having wavelengths between about one and about 12 micrometers and further, the coating exhibits little or no absorption at wavelengths between approximately one and approximately nine micrometers.

As an example, the reflection R, at a given wavelength, from a surface having an index of refraction $N_s$ is given by the equation $$R = \frac{(N_oN_s - N_f^2)^2}{(N_oN_s + N_f^2)^2} \quad (2)$$

where $N_o$ is the index of refraction of the incident medium; and $N_f$ is the index of refraction of the AR film layer. It can be seen that R will equal zero when $N_f^2 = N_oN_s$. In accordance with the example of a CdZnTe substrate having $N_s = 2.65$, $N_o = 1.0$ and a $CeO_xF_{(3.0-x)}$ film having an index of refraction of approximately 1.63 it can be seen that $(1.63)^2 = 2.65 = N_s$ and R will be equal to approximately zero, which is the desired result.

Furthermore, the AR coating of the invention has been found to be durable during typical device fabrication techniques. For example, repeated thermal cycling to 77° K., exposure to a concentrated HF soak and to a 4% Br in ethylene glycol etch solution has been found to have no effect upon the AR coating. Also, exposure to a typical photoresist cycle and to a wet hybridization solution has been found to have no discernible effect. The AR coating has also been found to resist scratching from plastic handling tools. Thus, it can be seen that the coating may be applied relatively early in the device fabrication cycle without danger of damaging the AR coating during subsequent device processing. This advantage significantly improves the productive yield of photodetector devices during fabrication.

It should be realized that the invention may be practiced with films comprised of fluoride compounds formed with a metal of the Lanthanide rate earth series which is transparent to infrared radiation. Another example is lanthanum oxyfluoride.

Thus, the presently preferred embodiments of the invention described above are not intended to be limiting. Furthermore, it is anticipated that those having skill in this art may envision modifications to the presently preferred embodiments of the invention based upon the disclosure given herein. As such, the invention is not intended to be limited to the description of the presently preferred embodiments provided above but is instead meant to be limited only as defined by the appended claims.

What is claimed is:

1. An antireflection coating for a material having an index of refraction between approximately 2.2 and 2.8, the coating comprising a layer of cerium oxyfluoride, said layer being formed upon a surface of the material to a predetermined physical thickness, said layer being substantially transparent to radiation within a predetermined range of wavelengths.

2. An antireflection coating as defined in claim 1 wherein said predetermined physical thickness is given by the expression $$PT = \frac{L}{4n}$$

where
PT is the physical thickness,
L is a wavelength of the radiation, and
n is the index of refraction of the layer.

3. An antireflection coating as defined in claim 2 wherein n equals approximately 1.6.

4. An antireflection coating as defined in claim 1 wherein the material is comprised of Group II-VI material.

5. An antireflection coating as defined in claim 4 wherein the material, is comprised of CdTe or CdZnTe.

6. An antireflection coating as defined in claim 1 wherein the predetermined range of wavelengths is approximately one to approximately nine microns.

7. A photodetecting device comprising:
  a substrate comprised of Group II-VI material having an index of refraction of between approximately 2.2 and approximately 2.8, said substrate being substantially transparent to radiation within a predetermined range of wavelengths;

a layer of photodetecting material formed upon a first surface of said substrate; and an antireflection layer formed upon a second, radiation receiving surface of said substrate, said antireflection layer comprising $CeO_xF_{(3.0-x)}$ where x is approximately zero to approximately 1.0.

8. A photodetecting device as defined in claim 7 wherein said substrate comprises CdTe or CdZnTe.

9. A photodetecting device as defined in claim 7 wherein said layer of photodetecting material comprises an epitaxial layer of HgCdTe.

10. A photodetecting device as defined in claim 7 wherein said predetermined range of wavelengths is approximately one to approximately nine micrometers.

11. A quarter wave antireflection coating for a backside illuminated photodiode array, the photodiode array being formed within an infrared radiation absorbing layer of HgCdTe which is epitaxially grown upon a surface of a substantially transparent CdZnTe or CdTe substrate, the antireflection coating being formed upon a radiation receiving surface of the substrate, the antireflection coating comprising a layer of $CeO_xF_{(3.0-x)}$, where x has a value within the range of approximately zero to approximately 1.0.

12. A coating as defined in claim 11 wherein the $CeO_xF_{(3.0-x)}$ layer is formed by ion beam sputtering, the $CeO_xF_{(3.0-x)}$ layer being sputtered from a source comprised of $CeF_3$ in the presence of a predetermined pressure of oxygen.

13. A coating as defined in claim 12 wherein the predetermined pressure of oxygen is approximately $5 \times 10^{-3}$ to $10^{-6}$ Torr.

14. A coating as defined in claim 11 wherein the index of refraction of the $CeO_xF_{(3.0-x)}$ layer is approximately 1.6.

15. A coating as defined in claim 11 wherein the coating is a quarter wave coating having a thickness which is a function of a predetermined wavelength of incident radiation.

16. A coating as defined in claim 15 wherein the coating has a physical thickness given by the expression:

$$PT = \frac{L}{4n}$$

where
PT = physical thickness,
L = the wavelength of the radiation, and
n = the index of refraction of the $CeO_xF_{(3.0-x)}$ where
PT=physical thickness,
L=the wavelength of the radiation, and
n=the index of refraction of the $CeO_xF_{(3.0-x)}$.

17. A quarter wave antireflection coating for a backside illuminated photodiode array, the photodiode array being formed within an infrared radiation absorbing layer of HgCdTe which is epitaxially grown upon a surface of a substantially transparent CdZnTe or CdTe substrate, the antireflection coating comprising an oxyfluoride compound formed with a metal of the Lanthanide rare earth series which is substantially transparent to infrared radiation.

18. A coating as defined in claim 17 wherein the metal is cerium.

19. A coating as defined in claim 17 wherein the metal is lanthanum.

* * * * *